United States Patent [19]

Murakami et al.

[11] Patent Number: 5,371,482
[45] Date of Patent: Dec. 6, 1994

[54] MAGNETOSTATIC WAVE DEVICE CONTAINING ACOUSTIC WAVE ABSORBING LAYER

[75] Inventors: Yasuhide Murakami, Kumagaya; Kohei Ito, Fukaya, both of Japan

[73] Assignee: Hitachi Metals, Ltd., Tokyo, Japan

[21] Appl. No.: 953,873

[22] Filed: Sep. 30, 1992

[30] Foreign Application Priority Data

Oct. 16, 1991 [JP] Japan .................. 3-266699
Jul. 3, 1992 [JP] Japan .................. 4-176472

[51] Int. Cl.⁵ .................................. H01P 1/218
[52] U.S. Cl. .................... 333/219.2; 333/245
[58] Field of Search ............. 333/148, 202, 204, 205, 333/219, 219.2, 235, 245, 201

[56] References Cited

U.S. PATENT DOCUMENTS

| | | | |
|---|---|---|---|
| 4,743,874 | 5/1988 | Kinoshita et al. | 333/219 |
| 4,777,462 | 10/1988 | Kunz et al. | 333/219 |
| 4,931,752 | 6/1990 | Bray et al. | 333/151 |
| 5,053,734 | 10/1991 | Murakami et al. | 333/263 X |
| 5,189,383 | 2/1993 | Murakami et al. | 333/201 |
| 5,192,928 | 3/1993 | Murakami et al. | 333/245 X |

FOREIGN PATENT DOCUMENTS

62-245704 10/1987 Japan .
2-13101 1/1990 Japan .
0298101 12/1990 Japan .................. 333/219.2

OTHER PUBLICATIONS

"MSSW Resonators with Straight Edge Reflectors", Ernst Ruijer et al., IEEE Transactions on Magnetic, vol. Mag–20, No. 5, Sep. 1984.

*Primary Examiner*—Seungsook Ham
*Attorney, Agent, or Firm*—Finnegan, Henderson, Farabow, Garrett & Dunner

[57] ABSTRACT

A circuit element utilizing magnetostatic is formed with an acoustic wave absorbing layer on the other major surface of a non-magnetic substrate remote from the major surface where a magnetostatic wave propagation medium is formed, for the purpose of effectively suppressing an unnecessary spurious mode over a wide frequency band so as to obviate undesirable degradation of the resonance characteristic. That is, the circuit element utilizing the magnetostatic wave includes a thin film of YIG formed on one of the major surfaces of the non-magnetic substrate of GGG by the method of liquid phase epitaxial growth, and electrodes formed on the YIG thin film. In the circuit element, an acoustic wave absorbing layer is formed on the other major surface of the GGG substrate remote from the major surface where the YIG thin film is formed.

4 Claims, 4 Drawing Sheets

MAGNETOSTATIC WAVE DEVICE CONTAINING ACOUSTIC WAVE ABSORBING LAYER

BACKGROUND OF THE INVENTION

This invention relates to a circuit element utilizing magnetostatic wave produced by magnetic spin resonance of a thin film of a magnetic material, such as, YIG (yttrium iron garnet) formed on a substrate of a non-magnetic material, such as, GGG (gadolinium gallium garnet), and more particularly to the structure of such a circuit element in which an unnecessary spurious mode is suppressed so that the circuit element can operate over a wide frequency band.

A ferrimagnetic thin-film resonance element has been proposed as a circuit element suitable for use in, for example, a microwave oscillator circuit. In such a circuit element, a thin film of YIG (yttrium iron garnet) epitaxially grown from a liquid phase on a non-magnetic substrate of GGG (gadolinium gallium garnet) is shaped into a desired pattern, as disclosed in, for example, JP-A-2-13101.

This ferrimagnetic thin-film resonance element has such various features that the value of Q of its resonance characteristic in the microwave frequency band is high, its resonance frequency is variable according to the strength of a DC biasing magnetic field applied in a direction perpendicular to the ferrimagnetic thin film magnetically coupled to a microwave transmission channel (such as, a finger-shaped electrode formed by etching), etc.

As a resonator utilizing the ferrimagnetic thin-film resonance described above, a circuit element utilizing magnetostatic wave has been proposed so as to facilitate adjustment of the magnetic coupling between the ferrimagnetic thin film and the microwave transmission channel and to also improve the degree of magnetic coupling between the ferrimagnetic thin film and the microwave transmission channel. In this circuit element, the microwave transmission channel is formed on the ferrimagnetic thin film by the technique of photoetching, as disclosed in, for example, JP-A-62-245704 corresponding to U.S. Pat. No. 4,743,874.

FIG. 2A schematically shows the structure of the prior art circuit element utilizing magnetostatic wave, and FIG. 2B schematically shows the structure of a prior art magnetostatic wave resonator 6 used in the circuit element shown in FIG. 2A. The prior art magnetostatic wave resonator 6 shown in FIG. 2B includes a thin film 3 of YIG formed on a substrate 2 of GGG by the method of epitaxial growth from a liquid phase, one or a plurality of finger-shaped electrodes 5 each in the form of a film of Au or Al formed by the technique of photoetching on the thin film 3 of YIG, and pad electrodes 4a and 4b formed by the technique of photoetching on both sides respectively of the group of the finger-shaped electrodes 5.

As shown in FIG. 2A, a conductive surface of a micro stripline 15 is partly removed, and a conductor strip 11 and an impedance matching stub 7 are formed on both sides respectively of the removed part g of the conductive surface of the micro stripline 15. Thus, the micro stripline 15 is disconnected at the gap g in a DC sense. After the magnetostatic wave resonator 6 shown in FIG. 2B is fixed to the area of the gap g of the micro stripline 15, the conductor strip 11 is electrically connected to the pad electrode 4a by a connector strip 12a, and the impedance matching stub 7 is electrically connected to the pad electrode 4b by a connector strip 12b to complete the circuit element 16 utilizing the magnetostatic wave.

When the transmission spectrum of the circuit element 16 utilizing the magnetostatic wave was measured, it was frequently observed that a spurious mode tended to appear in the vicinity of the lowest order resonance mode of the circuit element 16 as shown in FIG. 4. If all of these modes were attributable to the magnetostatic wave, the waveform shown in FIG. 4 should shift while maintaining the same form regardless of any variation in the strength of an externally applied magnetic field. However, in the case of the spurious mode, its resonance frequency sensitivity with respect to the variation in the strength of the externally applied magnetic field slightly differed in many cases from that of the lowest order resonance mode of the circuit element, and the position of the spurious mode relative to the lowest order resonance mode of the circuit element tended to change depending on the resonance frequency. Therefore, in the case of the spurious mode, it is likely that the resonance is not dependent on transmission of pure magnetostatic wave.

More concretely, when the resonance spectrum of the prior art circuit element utilizing the magnetostatic wave was observed while changing the resonance frequency at the lowest order resonance mode by gradually changing the strength of the externally applied magnetic field, the spurious mode observed on one side of the peak of the resonance at the lowest order resonance mode gradually approached the peak and then passed the peak to shift toward the other side of the peak. (Refer to IEEE Transaction on Magnetics, Vol.-Mag-20, No.5, September 1984.)

When these spurious modes overlapped the lowest order resonance mode, the peak at the lowest order resonance mode became dull, and the problems including a great reduction of the value of Q indicating the sharpness of resonance have resulted.

SUMMARY OF THE INVENTION

It is an object of the present invention to provide a circuit element utilizing magnetostatic wave in which the spurious mode can be suppressed over a wide frequency band and which can improve undesirable degradation of its resonance characteristic.

The present invention provides a circuit element utilizing magnetostatic wave, comprising a magnetostatic wave propagation medium formed on one of the major surfaces of a substrate of a non-magnetic material and an acoustic wave absorbing layer formed on the other major surface of the non-magnetic substrate.

The circuit element according to the present invention may have such a structure that a thin film of a ferrimagnetic material is formed on a substrate of a non-magnetic material, and electrodes are formed on the ferrimagnetic thin film so as to induce magnetostatic wave propagating through the ferrimagnetic thin film. The circuit element according to the present invention may have such another structure that a ferrimagnetic thin film is formed on a first non-magnetic substrate, and electrodes are formed on a second non-magnetic substrate so as to induce magnetostatic wave propagating through the ferrimagnetic thin film. The present invention will now be described in detail.

As a result of our strenuous researches, the inventors have concluded that occurrence of the spurious mode in the circuit element utilizing magnetostatic wave is attributable to reflection of acoustic wave. That is, the magnetostatic wave propagating through the ferrimagnetic thin film is combined with the acoustic wave by magnetic acoustic wave. This acoustic wave is then reflected by the other surface of the non-magnetic substrate remote from the surface where the ferrimagnetic thin film is formed. When this reflected acoustic wave is combined with the magnetostatic wave again, the phases of these waves coincide with each other, and the resonance between them produces standing wave. This is considered to be the source of occurrence of the spurious mode in the circuit element utilizing the magnetostatic wave. Therefore, in order to suppress occurrence of the spurious mode in the circuit element utilizing the magnetostatic wave, it is necessary to minimize the undesirable reflection of the acoustic wave in the circuit element.

An embodiment of the circuit element utilizing magnetostatic wave according to the present invention will be described by reference to FIGS. 1A and 1B in which like reference numerals are used to designate like parts appearing in FIGS. 2A and 2B. Referring now to FIGS. 1A and 1B, a magnetostatic wave resonator 6 comprises a magnetostatic wave propagation medium 3 formed on one major surface 2a of a substrate 2 of a non-magnetic material and an acoustic wave absorbing layer 8 formed on the other major surface 2b of the non-magnetic substrate 2. The material of the acoustic wave absorbing layer 8 may be any one of those having the function of absorbing the acoustic wave by consuming the energy of the acoustic wave by its internal friction. As suitable ones, an organic adhesive (for example, an epoxy resin type adhesive), a soldering paste and an electrically conductive adhesive can be used.

An impurity layer formed by, for example, implantation of impurity ions into the non-magnetic substrate can be used as the acoustic wave absorbing layer 8. This impurity layer acts to suppress lattice vibration thereby absorbing the reflected acoustic wave.

FIG. 3 shows another embodiment of the present invention, and, in FIG. 3, like reference numerals are used to designate like parts appearing in FIGS. 1A and 1B. Referring to FIG. 3, a thin film 3 of a ferrimagnetic material is formed on one major surface 2a of a substrate 2 of a non-magnetic material, and magnetostatic wave induced by electrodes 10 formed on another substrate 9 propagates through the ferrimagnetic thin film 3 to provide a magnetostatic wave resonator 6. In the circuit element including the resonator 6 having such a structure, an acoustic wave absorbing layer 8 is formed on the other major surface 2b of the non-magnetic substrate 2.

According to the circuit element of the present invention utilizing the magnetostatic wave, the unnecessary spurious mode can be effectively suppressed so that undesirable degradation of its resonance characteristic can be obviated. Such a remarkable advantage can be exhibited by the structure of the magnetostatic wave resonator incorporated in the circuit element of the present invention. That is, the layer consuming the energy of acoustic wave by its internal friction thereby absorbing the acoustic wave is formed on the surface of the non-magnetic substrate of the resonator remote from the surface where the ferrimagnetic thin film is formed, and the acoustic wave combined with the magnetostatic wave is absorbed at the surface of the non-magnetic substrate remote from the surface where the ferrimagnetic thin film is formed, so that the undesirable reflection of the acoustic wave from that surface of the substrate can be obviated.

DESCRIPTION OF THE PREFERRED EMBODIMENTS

Figure 1A:
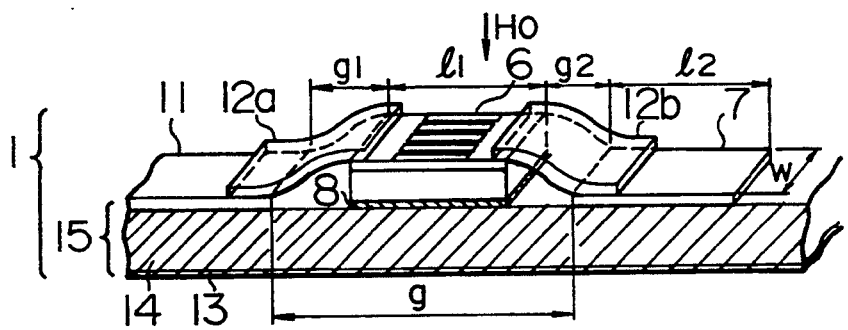
FIG. 1A is a perspective view schematically showing the structure of an embodiment of the circuit element utilizing magnetostatic wave according to the present invention.

Preferred embodiments of the present invention will now be described in detail by reference to the accompanying drawings.

EMBODIMENT 1

An embodiment of the present invention will now be described by reference to FIGS. 1A and 1B. First, as shown in FIG. 1B, a film 3 of YIG about 40 $\mu$m thick is formed by the method of liquid phase epitaxial growth on one major surface 2a of a substrate 2 of monocrystalline GGG. Then, a film of Au 1.5 $\mu$m thick is formed by the method of vacuum evaporation on the YIG film 3, and this Au film is partly removed by the method of photoetching to form five finger-shaped electrodes 5 and a pair of pad electrodes 4a and 4b located on both sides respectively of the electrode group 5. Each of the finger-shaped electrodes 5 is 30 $\mu$m wide and 3 mm long. Then, a magnetostatic wave resonator 6 is cut from the wafer by the use of a dicer having a diamond blade. The resonator 6 is 5 mm long, 2 mm wide and 0.5 mm thick.

Then, a layer 8 of an epoxy resin type adhesive is coated on the other major surface 2b of the monocrystalline GGG substrate 2 remote from the major surface 2a where the YIG film 3 is formed. On the other hand, a gap g having a length larger than the length $l_1$ of the magnetostatic wave resonator 6 is formed on a micro stripline 15 of a construction having a dielectric element 14 sandwiched between a pair of electrically conductive strips as shown in FIG. 1A. Also, a conductor strip 11 of copper acting as a connection terminal for a negative resistance circuit and an impedance matching stub 7 having a length $l_2$ and a width w are prepared.

Then, the magnetostatic wave resonator 6 (the resonator 6 in which the epoxy resin type adhesive layer 8 having the thickness of 10 μm is coated on the other major surface 2b of the monocrystalline GGG substrate 2 remote from the major surface 2a where the YIG film 3 is formed) is fixed to the area of the gap g formed on the micro stripline 15. After fixing the resonator 6 to the gap g, the pad electrode 4a is soldered to the conductor strip 11 by a connector strip 12a of copper, and the pad electrode 4b is soldered to the impedance matching stub 7 by a connector strip 12b of copper to complete the circuit element 1 utilizing the magnetostatic wave. The dielectric element 14 is made of a polytetrafluoroethylene resin. In FIG. 1A, the reference numeral 13 designates a conductor strip of copper for grounding the micro stripline 15, and the symbols $g_1$ and $g_2$ designate gaps each having a spacing of 0.5 mm.

Figure 6:
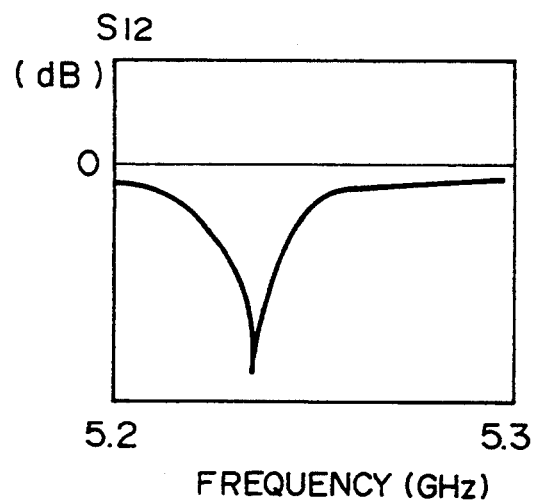
FIG. 6 shows the actually measured value of the pass characteristic of the embodiment of the circuit element of the present invention shown in FIG. 1A.

A biasing magnetic field Ho was applied to set the resonance frequency of this magnetostatic wave utilizing circuit element 1 at about 5 GHz, and a network analyzer was used to measure the pass characteristic of the magnetostatic wave utilizing circuit element 1. The result of measurement is shown in FIG. 6, and it will be seen in FIG. 6 that, in the frequency range between 5.2 GHz and 5.3 GHz, spurious resonance was absorbed and did not appear in a frequency range of ±20 MHz relative to that of the main resonance.

Further, when the strength of the biasing magnetic field was gradually changed to change the resonance frequency of the circuit element between 5.0 GHz and 5.5 GHz, spurious resonance was absorbed and did not appear in a frequency range of ±20 MHz relative to that of the main resonance. It is considered that the above fact is exhibited by the presence of the adhesive layer 8 absorbing the acoustic wave.

COMPARATIVE EXAMPLE (A Circuit Element Made According to a Prior Art Method)

Figure 2A:
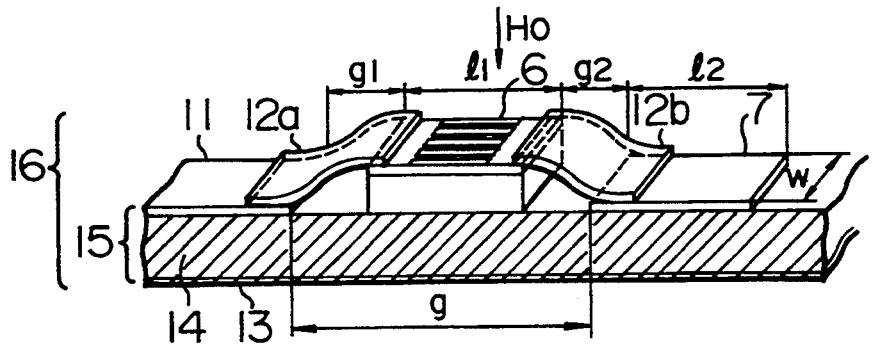
FIG. 2A is a perspective view schematically showing the structure of one form of a prior art circuit element utilizing magnetostatic wave.
Figure 2B:
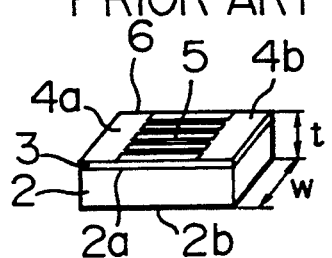
FIG. 2B is a perspective view schematically showing the structure of the magnetostatic wave resonator used in the circuit element shown in FIG. 2A.

As a comparative example, a circuit element 16 utilizing magnetostatic wave similar to that of Embodiment 1 was prepared as shown in FIG. 2A. This comparative example included a magnetostatic wave resonator similar to the resonator 6 used in Embodiment 1 but not having the epoxy resin type adhesive layer 8 as shown in FIG. 2B. The magnetostatic wave resonator 6 was fixed to an area of a gap g formed on a micro stripline 15 similar to that of Embodiment 1, and this gap g had a length larger than the length $l_1$ of the resonator 6. Similarly, a pad electrode 4a was soldered to a conductor strip 11 by a connector strip 12a of copper, and a pad electrode 4b was soldered to an impedance matching stub 7 by a connector strip 12b of copper.

Figure 4:
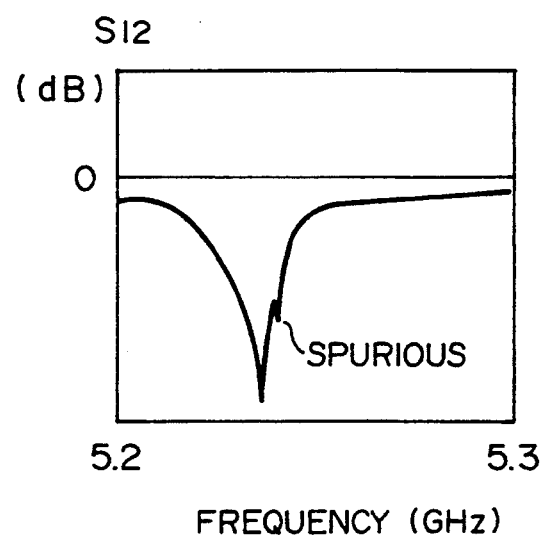
FIG. 4 shows the actually measured value of the pass characteristic of the prior art circuit element shown in FIG. 2A.

A biasing magnetic field Ho was applied to set the resonance frequency of the circuit element 16 at about 5 GHz, and a network analyzer was used to measure the pass characteristic of the circuit element 16. The result of measurement is shown in FIG. 4, and it will be seen in FIG. 4 that, in addition to the main resonance, small spurious resonance was observed in the vicinity of the main resonance in the frequency range between 5.2 GHz and 5.3 GHz.

Figure 5:
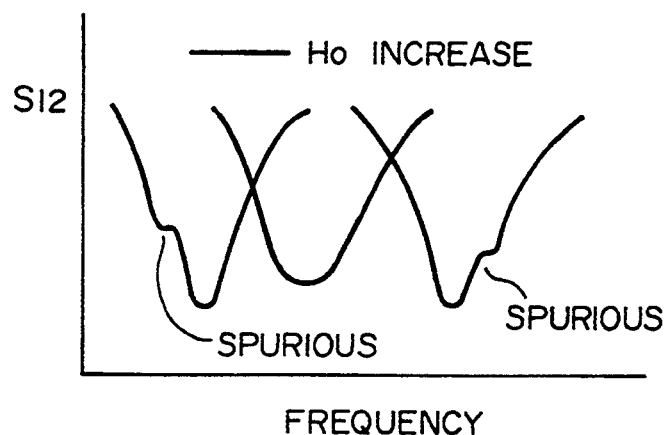
FIG. 5 shows the actually measured value of the pass characteristic of the prior art circuit element shown in FIG. 2A when the strength of the biasing magnetic field is changed.

Further, when the strength of the biasing magnetic field was gradually changed to change the resonance frequency between 5.0 GHz and 5.5 GHz, it was observed that the position of the spurious resonance located on the low frequency side relative to the main resonance shifted toward the high frequency side as shown in FIG. 5.

EMBODIMENT 2

Figure 3:
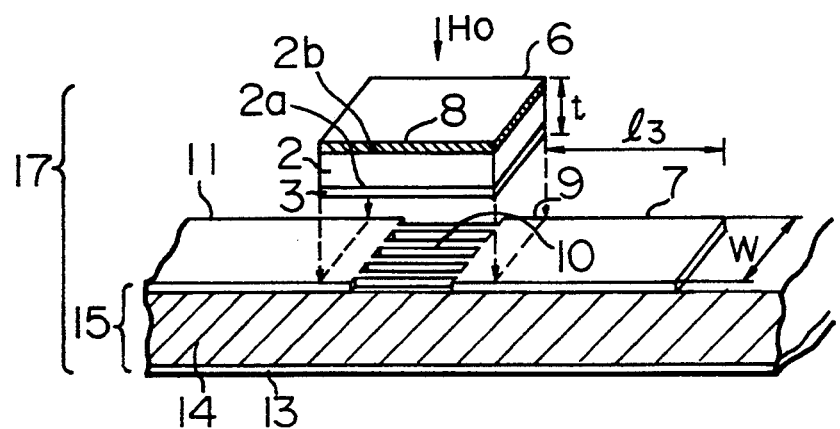
FIG. 3 is a perspective view schematically showing the structure of another embodiment of the present invention.

Embodiment 2 is shown in FIG. 3. In this embodiment, a magnetostatic wave resonator 6 similar to that used in Embodiment 1 is prepared. Also, on a micro stripline 15 of a construction having a dielectric element 14 sandwiched between a pair of electrically conductive strips, five finger-shaped electrodes 10 each being 30 μm wide and 3 mm long are formed by etching. Then, a conductive strip 11 of copper acting as a connection terminal for a negative resistance circuit, and another substrate (a second substrate) 9 having an impedance matching stub 7 (having a width w) are prepared. The magnetostatic wave resonator 6 is fixed to the area where the finger-shaped electrodes 10 are formed on the micro stripline 15 to complete the circuit element 17 utilizing the magnetostatic wave. Embodiment 2 differs from Embodiment 1 in that the major surface 2b coated with the epoxy resin type adhesive layer 8 having the thickness of 10 μm is located at an upper position relative to the major surface 2a located at a lower position as shown in FIG. 3.

Figure 8:
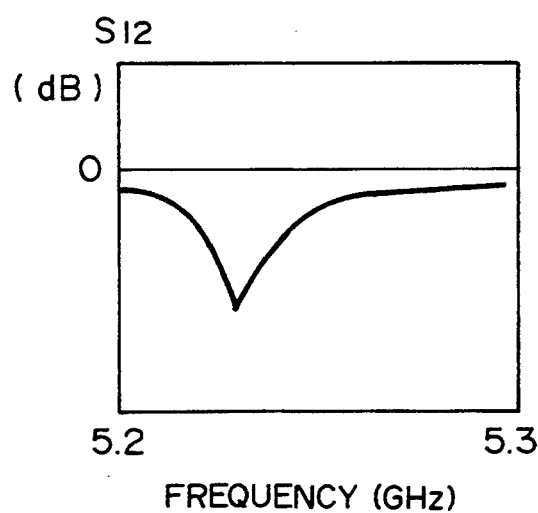
FIG. 8 shows the actually measured value of the pass characteristic of the embodiment of the circuit element of the present invention shown in FIG. 3 in which the finger-shaped electrodes are formed on another substrate (the second substrate).

A biasing magnetic field Ho was applied to the circuit element 17 to set the resonance frequency at about 5 GHz, and a network analyzer was used to measure the pass characteristic of the circuit element 17. The result of measurement is shown in FIG. 8, and it will be seen in FIG. 8 that, in this case too, any spurious resonance did not appear in a frequency range of ±20 MHz relative to the main resonance appearing in the frequency range between 5.2 GHz and 5.3 GHz.

Further, when the strength of the biasing magnetic field applied to the circuit element 17 was gradually changed to change the resonance frequency between 5.0 GHz and 5.5 GHz, any spurious resonance did not appear in a frequency range of ±20 MHz relative to that of the main resonance.

Figure 7:
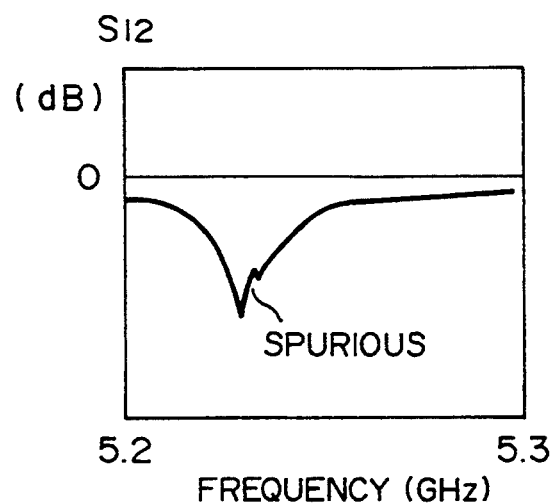
FIG. 7 shows the actually measured value of the pass characteristic of another form of the prior art circuit element utilizing magnetostatic wave in which the finger-shaped electrodes are formed on another substrate (a second substrate).

The prior art magnetostatic wave resonator not coated with the epoxy resin type adhesive layer 8 was incorporated in the circuit element 17 shown in FIG. 3, and a network analyzer was used to measure the pass characteristic of the circuit element 17 while applying a biasing magnetic field. The result of measurement is shown in FIG. 7, and it will be seen in FIG. 7 that, in addition to the main resonance appearing in the frequency range between 5.2 GHz and 5.3 GHz, small spurious resonance was observed in the vicinity of the main resonance. Also, the level of the peak of the resonance was about the half of that observed in the comparative circuit element 16 utilizing the magnetostatic wave.

EMBODIMENT 3

Figure 1B:
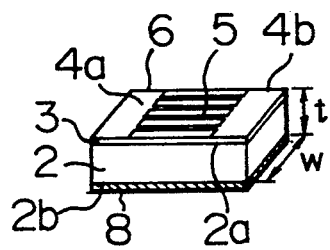
FIG. 1B is a perspective view schematically showing the structure of the magnetostatic wave resonator used in the circuit element shown in FIG. 1A.

Embodiment 3 differs from Embodiment 1 shown in FIG. 1A in that a magnetostatic wave resonator 6 coated with a 10 μm-thick layer of an electrically conductive adhesive called Dortite (Trade Name, Fujikura Kasei Co., Ltd., Electrically conductive adhesives comprising conductive powers, such as Ag, Cu—Ag, C, etc., and binder resins, such as epoxy, phenol, polyimide, etc.) is used in lieu of the resonator 6 having the coating of the epoxy resin type adhesive layer 8 shown in FIG. 1B. As in the case of Embodiment 1, this resonator 6 is fixed to the area of a gap g formed on a micro stripline 15 by etching and having a length larger than the length $l_1$ of the resonator 6. Then, a pad electrode 4a is soldered to a conductor strip 11 by a connector strip 12a of copper, and a pad electrode 4b is soldered to an impedance matching stub 7 by a connector strip 12b of copper to complete the circuit element 1 utilizing the magnetostatic wave.

A biasing magnetic field Ho was applied to set the resonance frequency of this circuit element 1 at about 5 GHz, and a network analyzer was used to measure the pass characteristic of the circuit element 1. The result of measurement is shown in FIG. 6, and it will be seen in FIG. 6 that, in this case too, spurious resonance was absorbed and did not appear in a frequency range of ±20 MHz relative to that of the main resonance appearing in the frequency range between 5.2 GHz and 5.3 GHz.

Further, when the strength of the biasing magnetic field was gradually changed to change the resonance frequency of the circuit element 1 between 5.0 GHz and 5.5 GHz, spurious resonance was absorbed and did not appear in a frequency range of ±20 MHz relative to that of the main resonance.

In the embodiments described above, the epoxy resin type adhesive and Dortite have been referred to as examples of the material suitable for forming the acoustic wave absorbing layer. However, it is apparent that the present invention is also effective for suppressing occurrence of spurious resonance when any other suitable organic adhesive, a soldering paste or any other suitable conductive adhesive is used.

Further, although the acoustic wave absorbing layer is formed on the major surface of the substrate remote from the major surface where the ferrimagnetic thin film is formed in the present invention, the acoustic wave absorbing layer may also be formed on the side surfaces of the substrate.

It will be understood from the foregoing detailed description of the present invention that, in a circuit element utilizing magnetostatic wave in which a magnetostatic wave propagation medium is formed on one of the major surfaces of a substrate of a non-magnetic material, a layer for absorbing acoustic wave is formed on the other major surface of the substrate, so that an unnecessary spurious mode can be effectively suppressed over a wide frequency band, and undesirable degradation of the resonance characteristic of the circuit element can be obviated.

We claim:

1. A circuit element utilizing a magnetostatic wave, comprising:
    means for exciting a magnetostatic wave;
    a substrate of a non-magnetic material including two major surfaces;
    a medium operatively connected to said exciting means for propagating the magnetostatic wave, the medium being formed on one of said two major surfaces of the substrate; and
    an acoustic wave absorbing layer formed on the other of said two major surfaces of said non-magnetic substrate for suppressing a spurious mode, wherein said medium comprises a thin film of a ferrimagnetic material, and said exciting means comprises electrodes formed on a second substrate of a non-magnetic material, said medium being placed on said electrodes to induce the magnetostatic wave propagating through said ferrimagnetic thin film.

2. A circuit element utilizing a magnetostatic wave according to claim 1, wherein said acoustic wave absorbing layer has a thickness of substantially 10 $\mu$m.

3. A circuit element utilizing a magnetostatic wave according to claim 1, wherein said acoustic wave absorbing layer is an electrically conductive adhesive.

4. A circuit element utilizing a magnetostatic wave according to claim 1, wherein said acoustic wave absorbing layer is a soldering paste.

* * * * *